(12) United States Patent
Omuro et al.

(10) Patent No.: US 12,444,626 B2
(45) Date of Patent: Oct. 14, 2025

(54) TEMPERATURE CONTROL DEVICE FOR SEMICONDUCTOR WAFER AND TEMPERATURE CONTROL METHOD FOR SEMICONDUCTOR WAFER

(71) Applicants: KELK Ltd., Hiratsuka (JP); TOKYO SEIMITSU CO., LTD., Hachioji (JP)

(72) Inventors: Wataru Omuro, Hiratsuka (JP); Atsushi Kobayashi, Hiratsuka (JP); Takashi Motoyama, Hachioji (JP); Takenori Takahashi, Hachioji (JP)

(73) Assignees: KELK Ltd., Hiratsuka (JP); TOKYO SEIMITSU CO., LTD., Hachioji (JP)

( * ) Notice: Subject to any disclaimer, the term of this patent is extended or adjusted under 35 U.S.C. 154(b) by 623 days.

(21) Appl. No.: 17/590,857

(22) Filed: Feb. 2, 2022

(65) Prior Publication Data

US 2022/0262660 A1      Aug. 18, 2022

(30) Foreign Application Priority Data

Feb. 17, 2021   (JP) ................................ 2021-023417

(51) Int. Cl.
*H01L 21/20* (2006.01)
*H01L 21/66* (2006.01)
*H01L 21/67* (2006.01)

(52) U.S. Cl.
CPC ........ *H01L 21/67248* (2013.01); *H01L 22/20* (2013.01)

(58) Field of Classification Search
CPC .......................... H01L 21/67248; H01L 22/20
See application file for complete search history.

(56) References Cited

U.S. PATENT DOCUMENTS

| 6,084,215 | A | 7/2000 | Furuya et al. |
| 10,096,506 | B2 | 10/2018 | Zhang et al. |
| 10,896,832 | B2 * | 1/2021 | Yamada ................. H01L 22/20 |

(Continued)

FOREIGN PATENT DOCUMENTS

| EP | 2560050 A1 | 2/2013 |
| JP | 11-168056 | 6/1999 |

(Continued)

*Primary Examiner* — Jeff W Natalini
*Assistant Examiner* — Alexander Belousov
(74) *Attorney, Agent, or Firm* — Troutman Pepper Locke LLP; James E. Armstrong, IV; Nicholas J. DiCeglie, Jr.

(57) ABSTRACT

A temperature control device for a semiconductor wafer includes a placement part having a placement surface on which a semiconductor wafer is placed and having a plurality of regions in which the placement surface is partitioned in a plan view, a temperature adjustment part configured to independently adjust a temperature of the placement part for each of the plurality of regions, a plurality of temperature detection parts provided in at least one of the plurality of regions and configured to detect a temperature of the region of which the temperature has been adjusted by the temperature adjustment part, and a control part configured to monitor detection temperatures of the plurality of temperature detection parts, to select one having a large temperature change per unit time among a plurality of monitored detection temperatures, and to control the temperature adjustment part based on the selected detection temperature.

6 Claims, 4 Drawing Sheets

(56) References Cited

U.S. PATENT DOCUMENTS

| | | | |
|---|---|---|---|
| 10,903,097 B2 * | 1/2021 | Baggett | H01J 37/20 |
| 11,107,709 B2 * | 8/2021 | Wirth | H01L 21/67109 |
| 11,295,960 B1 * | 4/2022 | Hattori | H01L 21/31116 |
| 11,728,187 B2 * | 8/2023 | Baggett | H01L 21/67098 |
| | | | 219/444.1 |
| 11,837,478 B2 * | 12/2023 | Wirth | H01L 21/6719 |
| 12,125,708 B2 * | 10/2024 | Hattori | H01L 21/31116 |
| 2013/0045447 A1 * | 2/2013 | Kunnen | G03F 7/70875 |
| | | | 219/443.1 |
| 2017/0269616 A1 * | 9/2017 | Mimura | G05D 23/1917 |
| 2018/0033660 A1 * | 2/2018 | Momma | H01L 22/20 |
| 2018/0197761 A1 * | 7/2018 | Ferrara | C23C 14/56 |
| 2019/0164852 A1 * | 5/2019 | Peng | H01L 21/67253 |
| 2019/0304820 A1 * | 10/2019 | Baggett | H01L 21/67248 |
| 2019/0371634 A1 * | 12/2019 | Yamada | H01L 21/67288 |
| 2020/0203196 A1 * | 6/2020 | Baggett | H01J 37/32724 |
| 2020/0243354 A1 * | 7/2020 | Wirth | F27D 5/0037 |
| 2021/0358777 A1 * | 11/2021 | Wirth | F27D 21/0014 |
| 2021/0366746 A1 * | 11/2021 | Ferrara | H01J 37/3171 |
| 2022/0115239 A1 * | 4/2022 | Hattori | H01L 21/67115 |
| 2022/0223440 A1 * | 7/2022 | Kumar | H01L 22/20 |
| 2022/0246459 A1 * | 8/2022 | Omuro | H01L 21/67742 |
| 2022/0262660 A1 * | 8/2022 | Omuro | H01L 21/67248 |
| 2023/0086151 A1 * | 3/2023 | Koh | H01L 21/67248 |
| | | | 438/121 |
| 2023/0378004 A1 * | 11/2023 | Igarashi | H01L 21/67248 |
| 2024/0136212 A1 * | 4/2024 | Hayashi | H01L 21/67248 |
| 2024/0234186 A9 * | 7/2024 | Hayashi | H01L 21/67248 |
| 2024/0258139 A1 * | 8/2024 | Hayashi | H01L 21/67109 |
| 2024/0312789 A1 * | 9/2024 | Hattori | H01L 21/3065 |

FOREIGN PATENT DOCUMENTS

| | | |
|---|---|---|
| JP | 2003-023062 A | 1/2003 |
| JP | 2013-042127 A | 2/2013 |
| JP | 2016-192485 A | 11/2016 |
| JP | 2017-167813 A | 9/2017 |
| KR | 10-1999-0045000 A | 6/1999 |

* cited by examiner

TEMPERATURE CONTROL DEVICE FOR SEMICONDUCTOR WAFER AND TEMPERATURE CONTROL METHOD FOR SEMICONDUCTOR WAFER

CROSS-REFERENCE TO RELATED APPLICATION

Priority is claimed on Japanese Patent Application No. 2021-023417, filed Feb. 17, 2021, the content of which is incorporated herein by reference.

BACKGROUND

Field of the Invention

The present invention relates to a temperature control device for a semiconductor wafer and a temperature control method for a semiconductor wafer.

Description of Related Art

As a temperature control device for a semiconductor wafer, for example, Japanese Unexamined Patent Application, First Publication No. 2017-167813 discloses a device in which a temperature of a semiconductor wafer is controlled to a target temperature and an in-plane temperature distribution of the semiconductor wafer is controlled. The temperature control device includes a stage having a plurality of zones concentrically divided in a plan view, a plurality of temperature adjustment parts provided in each of the zones, and a temperature sensor provided in each of the zones. Only one temperature sensor is provided in each of the zones.

On the other hand, Japanese Unexamined Patent Application, First Publication No. 2016-192485 discloses a prober which inspects electrical characteristics by energizing a chip formed on a semiconductor wafer. The prober includes a wafer mount which holds the semiconductor wafer, a probe which is formed according to an electrode position of the chip, and a temperature control device. The temperature control device includes a heating mechanism which heats the wafer mount, and a cooling mechanism which cools the wafer mount. The cooling mechanism includes a mount cooling line which circulates a cooling liquid in the wafer mount.

SUMMARY

In Japanese Unexamined Patent Application, First Publication No. 2017-167813, since only one temperature sensor is provided in each of the zones of the stage, when there is a local heat input in the zone, and the temperature sensor is disposed far away from a heat input position, it takes time to detect a temperature change, and a response may diminish.

In Japanese Unexamined Patent Application, First Publication No. 2016-192485, since the temperature is controlled by the circulation of the cooling liquid, a response to a change in a setting temperature may diminish.

Therefore, an object of the present invention is to provide a temperature control device for a semiconductor wafer and a temperature control method for a semiconductor wafer which can respond quickly even when there is a local heat input on a placement surface on which a semiconductor wafer is placed.

A temperature control device for a semiconductor wafer according to one aspect of the present invention includes a placement part having a placement surface on which a semiconductor wafer is placed and having a plurality of regions into which the placement surface is partitioned in a plan view, a temperature adjustment part configured to independently adjust a temperature of the placement part for each of the plurality of regions, a plurality of temperature detection parts provided in at least one of the plurality of regions and configured to detect a temperature of the region of which the temperature has been adjusted by the temperature adjustment part, and a control part configured to monitor detection temperatures of the plurality of temperature detection parts, to select one having a large temperature change per unit time among a plurality of monitored detection temperatures, and to control the temperature adjustment part based on the selected detection temperature.

A temperature control method for a semiconductor wafer according to one aspect of the present invention includes monitoring temperatures at a plurality of locations in at least one of a plurality of regions partitioned from each other in a plan view, placing a semiconductor wafer on a placement surface having the plurality of regions, selecting one having a largest temperature change per unit time among the monitored temperatures at the plurality of locations, and adjusting a temperature of the region based on the selected temperature.

According to the above aspect, even when there is a local heat input to a placement surface on which a semiconductor wafer is placed, it is possible to respond quickly.

DESCRIPTION OF EMBODIMENTS

Hereinafter, an embodiment of the present invention will be described with reference to the drawings. In the embodiment, as an example of a temperature control device for a semiconductor wafer, a temperature control device in which a temperature (a temperature of a semiconductor wafer having a local heat input due to energization) of a semiconductor wafer having a chip of which electrical characteristics are inspected by energization is controlled to a target temperature will be described. For example, the semiconductor wafer is formed in a disk shape.

<Temperature Control Device>

Figure 1:
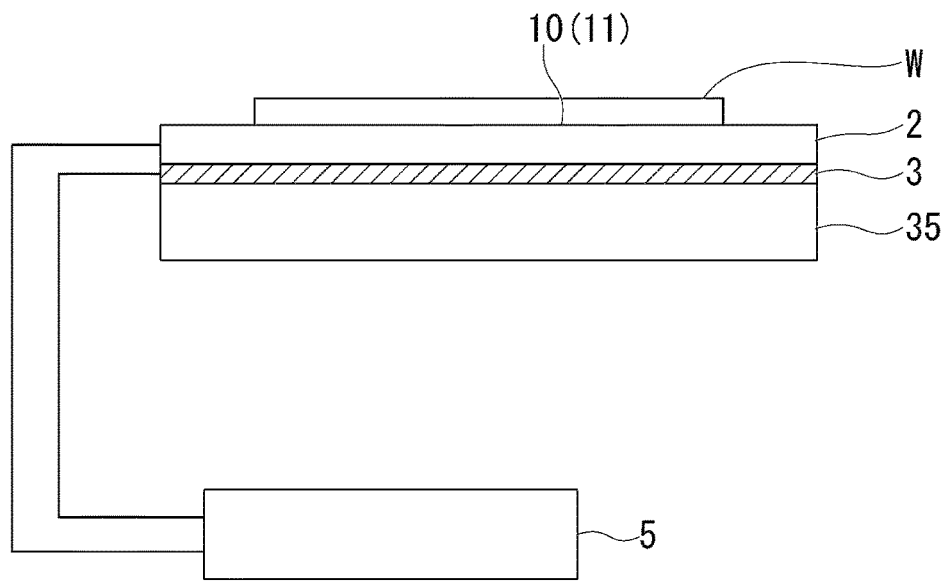
FIG. 1 is a block diagram of a temperature control device according to an embodiment.
Figure 2:
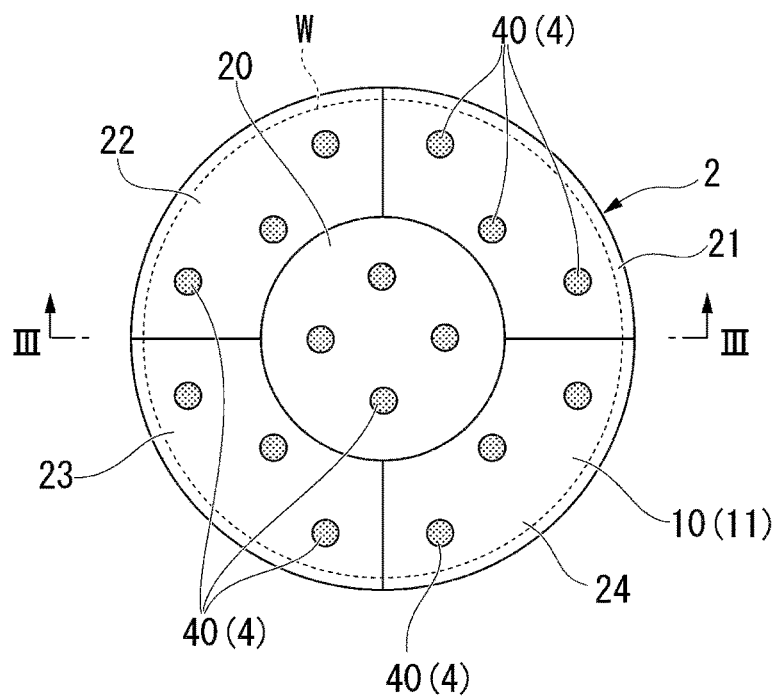
FIG. 2 is a plan view showing an arrangement of a temperature detection part according to the embodiment.

FIG. 1 is a block diagram of a temperature control device 1. FIG. 2 is a plan view showing an arrangement of a temperature detection part 4. In FIG. 2, a semiconductor wafer W is shown by a broken line, and the temperature detection part 4 is shown by a solid line.

As shown in FIG. 1, the temperature control device 1 includes a placement part 2, a temperature adjustment part 3, the temperature detection part 4 (refer to FIG. 2), and a control part 5. Each of the elements of the temperature control device 1 is controlled by the control part 5.

<Placement Part>

A placement part 2 has a placement surface 10 on which the semiconductor wafer W is placed. The placement part 2 is formed in a disk shape having the placement surface 10 on a first surface 11 thereof. As shown in FIG. 2, the placement surface 10 is formed in a circular shape in a plan view. For example, an outer diameter of the placement surface 10 is set to be equal to or larger than an outer diameter of the semiconductor wafer W. The placement surface 10 has a plurality of (for example, five in the present embodiment) regions 20 to 24 which are partitioned from each other in a plan view.

The plurality of regions 20 to 24 include a central region 20 which is provided in a center of the placement surface 10 in a plan view, and a plurality of (for example, four in the present embodiment) outer regions 21 to 24 which are provided outside the central region 20 in a radial direction in a plan view.

The central region 20 is formed in a perfect circular shape (a circular shape) in a plan view. For example, when the semiconductor wafer W is placed on the placement surface 10, the central region 20 overlaps a central portion of the semiconductor wafer W in a plan view.

For example, when the semiconductor wafer W is placed on the placement surface 10, the four outer regions 21 to 24 overlap an outer peripheral portion of the semiconductor wafer W in a plan view. The four outer regions 21 to 24 are partitioned from each other in a circumferential direction. Each of the outer regions 21 to 24 is formed in a circular arc shape (an arc shape) in a plan view. Each of the outer regions 21 to 24 has a shape in which an annular region surrounding the central region 20 is evenly divided into four in the circumferential direction in a plan view. That is, the four outer regions 21 to 24 each have the same shape in a plan view. The four outer regions 21 to 24 are a first outer region 21, a second outer region 22, a third outer region 23, and a fourth outer region 24. The first outer region 21, the second outer region 22, the third outer region 23, and the fourth outer region 24 are arranged in order counterclockwise around the central region 20 in a plan view.

Figure 3:
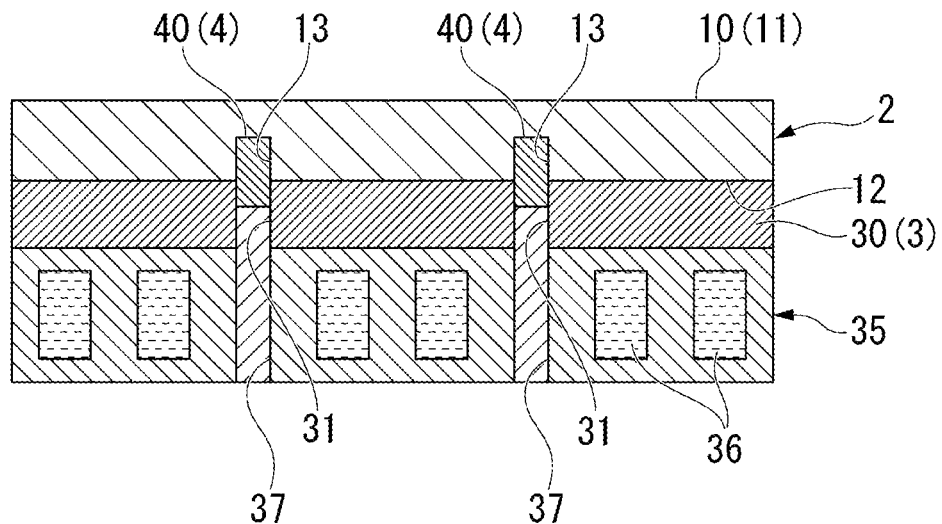
FIG. 3 is a cross-sectional view along line III-III of FIG. 2.

FIG. 3 is a cross-sectional view along line III-III of FIG. 2.

As shown in FIG. 3, the placement part 2 has recessed parts 13 which open to a second surface 12 on the side opposite to the first surface 11. The recessed parts 13 are not open to the first surface 11 (the placement surface 10). A plurality of the recessed parts 13 are provided in each of the plurality of regions 20 to 24 (refer to FIG. 2). For example, four of the plurality of recessed parts 13 are provided in the central region 20, and three are provided in each of the outer regions 21 to 24.

<Temperature Adjustment Part>

A temperature adjustment part 3 independently adjusts the temperature of the placement part 2 for each of the plurality of regions 20 to 24. For example, the temperature adjustment part 3 includes thermoelectric elements 30 such as Peltier elements. For example, the thermoelectric elements 30 are provided in each of the plurality of regions 20 to 24. For example, when the plurality of thermoelectric elements 30 are energized, each of the regions 20 to 24 can be independently heated and cooled. Each of the thermoelectric elements 30 in each of the regions 20 to 24 is controlled by the control part 5 (refer to FIG. 1).

The temperature adjustment part 3 is provided on the second surface 12 of the placement part 2. The temperature adjustment part 3 has through holes 31 connected to the recessed parts 13. The plurality of through holes 31 are provided to correspond to the recessed parts 13. For example, four of the plurality of through holes 31 are provided in the central region 20, and three are provided in each of the outer regions 21 to 24.

A cooling part 35 which cools the temperature adjustment part 3 is provided on a surface of the temperature adjustment part 3 on the side opposite to a surface facing the placement part 2. For example, the cooling part 35 is a water cooling plate. For example, the water cooling plate has cooling passages 36 through which cooling water can flow. For example, the cooling passages 36 are provided in each of the plurality of regions 20 to 24. For example, each of the regions 20 to 24 can be cooled independently by driving a pump (not shown) and causing cooling water to flow through each of the cooling passages 36. The pump corresponding to each of the regions 20 to 24 is controlled by the control part 5 (refer to FIG. 1).

The cooling part 35 has insertion holes 37 connected to the through holes 31 of the temperature adjustment part 3. A plurality of insertion holes 37 are provided to correspond to the through holes 31. For example, four of the plurality of insertion holes 37 are provided in the central region 20, and three are provided in each of the outer regions 21 to 24.

<Temperature Detection Part>

A temperature detection part 4 detects the temperatures in the regions 20 to 24 (refer to FIG. 2) of which the temperatures have been adjusted by the temperature adjustment part 3. For example, the temperature detection part 4 includes temperature sensors 40 such as resistance temperature detectors (RTDs) and thermocouples (TCs). A plurality of temperature sensors 40 are provided in each of the plurality of regions 20 to 24. For example, as shown in FIG. 2, four temperature sensors 40 are provided in the central region 20, and three temperature sensors 40 are provided in each of the outer regions 21 to 24. As shown in FIG. 3, the temperature sensors 40 are disposed in the recessed parts 13 of the placement part 2 through the insertion holes 37 of the cooling part 35 and the through holes 31 of the temperature adjustment part 3.

As shown in FIG. 2, the plurality of temperature sensors 40 are disposed apart from each other in the circumferential direction and the radial direction of the placement surface 10 in a plan view. The plurality of temperature sensors 40 are disposed apart from each other in the central region 20 and each of the plurality of outer regions 21 to 24 in a plan view. For example, the four temperature sensors 40 in the central region 20 are disposed at the same positions in the radial direction and are disposed at the same intervals in the circumferential direction. For example, among the three temperature sensors 40 in each of the outer regions 21 to 24, one of the three which is located in the middle in the circumferential direction is disposed further inward than the other two in the radial direction, and the three are disposed at the same intervals as each other in the circumferential direction. A detection temperature of each of the temperature sensors 40 is input to the control part 5 (refer to FIG. 1).

<Control Part>

The control part 5 monitors the detection temperatures of the plurality of temperature sensors 40. The control part 5 selects one having the largest temperature change per unit time among a plurality of monitored detection temperatures. For example, the control part 5 selects one having the largest average value of the temperature change per unit time among the plurality of monitored detection temperatures. The control part 5 controls the temperature adjustment part 3 on the basis of the selected detection temperature. For example, the control part 5 controls the temperature adjustment part 3 in a proportional integral derivative (HD) manner so that the temperature in a predetermined region (for example, at least one of the plurality of regions 20 to 24) becomes a target temperature on the basis of the selected detection temperature.

In the present embodiment, the case in which the control part 5 selects one having the largest average value of the temperature change per unit time among the plurality of monitored detection temperatures has been described, but the present invention is not limited thereto. For example, the control part 5 may select one having an average value of the temperature change per unit time larger than a predetermined value (for example, a predetermined threshold value) among the plurality of monitored detection temperatures. That is, the control part 5 may select one having a large temperature change per unit time among the plurality of monitored detection temperatures, and may control the temperature adjustment part 3 on the basis of the selected detection temperature.

<Temperature Control Method>

Figure 4:
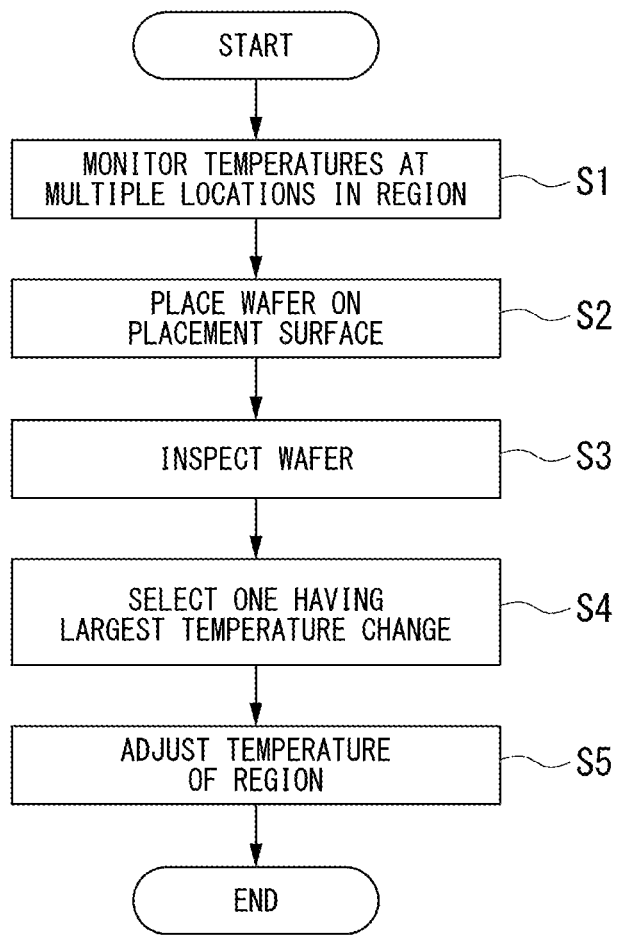
FIG. 4 is a flowchart of a temperature control method according to the embodiment.

FIG. 4 is a flowchart of a temperature control method.

The temperature control method includes a temperature monitoring process (Step S1 in FIG. 4), a wafer placement process (Step S2 in FIG. 4), a wafer inspection process (Step S3 in FIG. 4), a temperature selection process (Step S4 in FIG. 4), and a temperature adjustment process (Step S5 in FIG. 4).

In the temperature monitoring process, the temperature is monitored at a plurality of locations in at least one region of the plurality of regions 20 to 24 partitioned from each other in a plan view. For example, in the temperature monitoring process, the temperature is monitored at a plurality of locations in each of the plurality of regions 20 to 24. For example, in the temperature monitoring process, all of the plurality of temperature sensors 40 provided in each of the plurality of regions 20 to 24 are constantly monitored. After the temperature monitoring process, the process proceeds to the wafer placement process (Step S2 in FIG. 4).

For example, in the wafer placement process, the semiconductor wafer W is placed on the placement surface 10 having the plurality of regions 20 to 24 (Step S2 in FIG. 4). For example, in the wafer placement process, the disk-shaped semiconductor wafer W is placed to entirely overlap the circular placement surface 10 in a plan view. After the wafer placement process, the process proceeds to the wafer inspection process (Step S3 in FIG. 4).

In the wafer inspection process, the semiconductor wafer W placed on the placement surface 10 is inspected. For example, a local heat input is generated by the inspection of the semiconductor wafer W. After the wafer inspection process, the process proceeds to the temperature selection process (Step S4 in FIG. 4).

In the temperature selection process, the one having the largest temperature change per unit time among the monitored temperatures at the plurality of locations is selected. For example, in the temperature selection process, the one having the largest average value of the temperature change per unit time among the plurality of monitored detection temperatures is selected.

Figure 5:
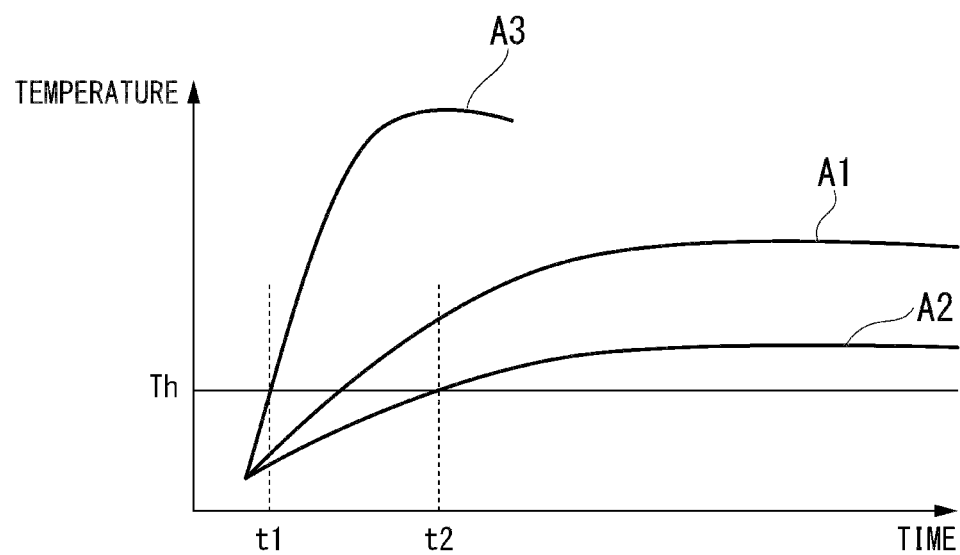
FIG. 5 is an explanatory diagram of a temperature change in a plurality of detection temperatures according to the embodiment.

FIG. 5 is an explanatory diagram of the temperature change in the plurality of detection temperatures. In FIG. 5, a vertical axis represents temperature, and a horizontal axis represents time.

For example, as shown in FIG. 5, in the temperature selection process, one in which a maximum value of the temperature change per unit time (time t1 to t2) is equal to or less than a temperature control start threshold value Th is selected among the plurality of monitored detection temperatures (graphs A1 to A3).

For example, when there is a local heat input in a predetermined region on the placement surface 10, the temperature changes of the three temperature sensors 40 (refer to FIG. 2) provided in the predetermined region are different from each other. For example, as shown in FIG. 5, it is assumed that, in the detection temperatures (graphs A1 to A3) of the three temperature sensors 40, there are two (two graphs A1 and A2) in which the maximum value of the temperature change per unit time is equal to or less than the temperature control start threshold value Th. For example, the detection temperature (graph A1) of one of the two temperature sensors 40 which is close to a heat input position rises sharply. On the other hand, the detection temperature (graph A2) of the other of the two temperature sensors 40 which is far from the heat input position gradually rises. For example, in the temperature selection process, the detection temperature (graph A1) of the temperature sensor 40 is selected. After the temperature selection process, the process proceeds to the temperature adjustment process (Step S5 in FIG. 4).

In the temperature adjustment process, a temperature in a predetermined region is adjusted on the basis of the selected temperature (graph A1). For example, in the temperature adjustment process, the temperature of the first outer region 21 (refer to FIG. 2) is adjusted on the basis of the detection temperature (graph A1) of the temperature sensor 40.

<Temperature Control>

Figure 6:
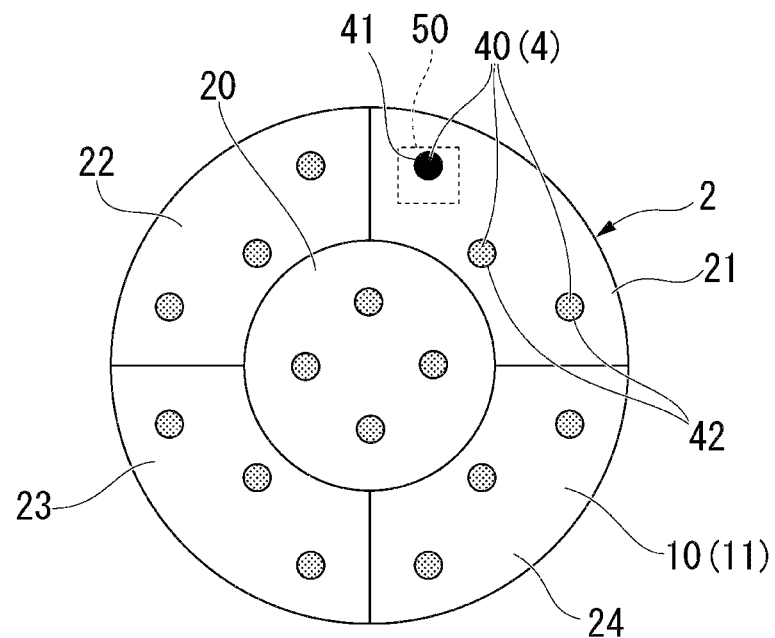
FIG. 6 is a plan view for explaining an example of temperature control according to the embodiment.

FIG. 6 is a plan view for explaining an example of temperature control.

As described above, the semiconductor wafer has a chip of which electrical characteristics are inspected by energization. In FIG. 6, a rectangular chip 50 is shown by a broken line, the semiconductor wafer is not shown, and the temperature detection part 4 is shown by a solid line in a plan view.

For example, as shown in FIG. 6, when the electrical characteristics of the chip 50 are inspected by energization, a portion (a part of the first outer region 21 in the example of FIG. 6) of the placement surface 10 which overlaps the chip 50 in a plan view has a local heat input.

Here, one (a temperature sensor 41 indicated by a black circle) of the three temperature sensors 40 provided in the first outer region 21 overlaps the chip 50 in a plan view. On the other hand, the other two (temperature sensors 42 indicated by dot hatch circles) of the three temperature sensors 40 provided in the first outer region 21 are disposed apart from the chip 50 in a plan view. Therefore, the one (the temperature sensor 41 indicated by a black circle) of the three temperature sensors 40 has the largest temperature change per unit time. Therefore, the temperature change of the first outer region 21 can be quickly detected by adjusting the temperature of the first outer region 21 on the basis of the one (the temperature sensor 41 indicated by a black circle) of the three temperature sensors 40, compared with a case in which the temperature of the first outer region 21 is adjusted on the basis of the other two (the temperature sensors 42 indicated by dot hatch circles).

<Effect>

As described above, the temperature control device 1 of the present embodiment includes the placement part 2 having the placement surface 10 on which the semiconductor wafer W is placed and having the plurality of regions 20 to 24 in which the placement surface 10 is partitioned in a plan view, the temperature adjustment part 3 which independently adjusts the temperature of the placement part 2 for each of the plurality of regions 20 to 24, the temperature detection part 4 which is provided in plural in at least one of the plurality of regions 20 to 24 and detects the temperature of the region of which the temperature has been adjusted by the temperature adjustment part 3, and the control part 5 which monitors the detection temperatures of the plurality of temperature detection parts 4, selects the one having the largest temperature change per unit time from the plurality of monitored detection temperatures and controls the temperature adjustment part 3 on the basis of the selected detection temperature.

With such a constitution, the temperature is monitored at a plurality of locations in at least one region of the plurality of regions 20 to 24 partitioned from each other in a plan view, the semiconductor wafer W is placed on the placement surface 10 having the plurality of regions 20 to 24, the one having the largest temperature change per unit time among the monitored temperatures at the plurality of locations is selected, and thus the temperature of the region can be adjusted on the basis of the selected temperature. Therefore, even when there is a local heat input on the placement surface 10 on which the semiconductor wafer W is placed, it is possible to respond quickly.

For example, when only one temperature sensor is provided in each of the regions on the placement surface, and there is a local heat input in the region, and the temperature sensor is disposed far away from the heat input position, it takes time to detect the temperature change, and the response may be diminished. On the other hand, according to the constitution of the present embodiment, since the plurality of temperature sensors 40 are provided in at least one of the plurality of regions 20 to 24, even when there is a local heat input in the regions 20 to 24, at least one of the plurality of temperature sensors 40 is located closer to the heat input position than the others. Therefore, the time required to detect the temperature change can be shortened, and the response can be improved.

In addition, in the present embodiment, since the temperature of each of the regions 20 to 24 is controlled by the thermoelectric element 30 such as a Peltier element, the response to a change in the setting temperature can be improved as compared with a case in which the temperature is adjusted by circulating the cooling liquid.

Further, in the present embodiment, since the one having the largest temperature change per unit time among the monitored temperatures at the plurality of locations is selected, and the temperature of the region is adjusted on the basis of the selected temperature, the temperature of the region can be adjusted to an optimum temperature while the temperature control is simplified, as compared with a case in which the temperature of the region is controlled on the basis of all the monitored temperatures. That is, in the present embodiment, while a plurality of temperature monitoring locations (monitoring points) are provided in a predetermined region, there is only one temperature control location (control point, for example, the temperature sensor 41 indicated by a black circle in FIG. 6), and thus the temperature can be quickly and accurately adjusted to the target temperature.

Further, in the present embodiment, since the temperature is controlled using the thermoelectric element 30 such as the Peltier element, it is not necessary to add a heating mechanism and a cooling mechanism required in the case in which the temperature is controlled by circulating the cooling liquid. Therefore, energy consumption can be reduced, and an equipment installation space can be reduced.

In the present embodiment, the placement surface 10 is formed in a circular shape in a plan view. The plurality of temperature detection parts 4 are disposed apart from each other in the circumferential direction and the radial direction of the placement surface 10 in a plan view.

Therefore, even when there is a local heat input at an arbitrary position on the placement surface 10 on which the semiconductor wafer W is placed, it is possible to respond quickly.

In the present embodiment, the plurality of regions 20 to 24 include the central region 20 which is provided in the center of the placement surface 10 in a plan view and is formed in a circular shape in a plan view, and the plurality of outer regions 21 to 24 which are partitioned from each other in the circumferential direction on a radially outer side of the central region 20 in a plan view and are formed in an arc shape in a plan view. A plurality of temperature detection parts 4 are provided in each of the plurality of regions 20 to 24. The plurality of temperature detection parts 4 are disposed apart from each other in the central region 20 and the plurality of outer regions 21 to 24 in a plan view.

Therefore, even when the disk-shaped semiconductor wafer W is placed on the placement surface 10, and there is a local heat input at an arbitrary position in each of the regions 20 to 24, it is possible to respond quickly.

In the present embodiment, the placement part 2 is formed in a plate shape having the placement surface 10 on the first surface 11. The temperature adjustment part 3 is provided on the second surface 12 on the side of the placement part 2 opposite to the side on which the placement surface 10 is provided. The placement part 2 has the recessed part 13 which opens on the second surface 12. The temperature adjustment part 3 has the through hole 31 connected to the recessed part 13. The temperature detection part 4 is disposed in the recessed part 13 through the through hole 31.

Therefore, the temperature of the region can be accurately detected through the recessed part 13 of the placement part 2 by the temperature detection part 4. In addition, when the semiconductor wafer W is placed on the placement surface 10, the temperature detection part 4 can be disposed so as not to be an obstacle.

In the temperature control method of the present embodiment, the temperature is monitored at a plurality of locations in at least one region of the plurality of regions 20 to 24 partitioned from each other in a plan view, the semiconductor wafer W is placed on the placement surface 10 having the plurality of regions 20 to 24, the one having the largest temperature change per unit time among the monitored temperatures at the plurality of locations is selected, and the temperature of the region is adjusted on the basis of the selected temperature.

Therefore, even when there is a local heat input on the placement surface 10 on which the semiconductor wafer W is placed, it is possible to respond quickly.

OTHER EMBODIMENTS

In the above-described embodiment, the example in which the placement surface is formed in a circular shape in a plan view has been described, but the present invention is not limited thereto. For example, the placement surface may be formed in a rectangular shape in a plan view. For example, the shape of the placement surface in a plan view can be changed according to the required specifications such as the shape of the semiconductor wafer and the like.

In the above-described embodiment, the example in which the plurality of temperature detection parts are disposed apart from each other in the circumferential direction and the radial direction of the placement surface in a plan view has been described, but the present invention is not limited thereto. For example, the plurality of temperature detection parts may not be disposed apart from each other in the circumferential direction and the radial direction of the placement surface in a plan view. For example, an arrangement mode of the plurality of temperature detection parts can be changed according to the required specifications.

In the above-described embodiment, the example in which the plurality of regions include the central region which is provided in the center of the placement surface in a plan view and is formed in a circular shape in a plan view, and a plurality of outer regions which are partitioned from each other in the circumferential direction on the radially outer side of the central region in a plan view and are formed in an arc shape in a plan view has been described, but the present invention is not limited thereto. For example, the plurality of regions may include a plurality of annular regions formed concentrically with the central region in a plan view. For example, the shape and arrangement mode of each of the regions can be changed according to the required specifications.

In the above-described embodiment, the example in which the plurality of temperature detection parts are provided in each of the plurality of regions has been described, but the present invention is not limited thereto. For example, the plurality of temperature detection parts may be provided in only one of the plurality of regions. For example, the plurality of temperature detection parts may be provided in at least one of the plurality of regions. For example, the number and position of the temperature detection parts installed can be changed according to the required specifications.

In the above-described embodiment, the example in which the control part monitors the detection temperatures of the plurality of temperature detection parts provided in a predetermined region (the first outer region 21 in the example of FIG. 6), selects the one having the largest temperature change per unit time among the plurality of monitored detection temperatures, and controls the temperature adjustment part on the basis of the selected detection temperature has been described, but the present invention is not limited thereto.

Figure 7:
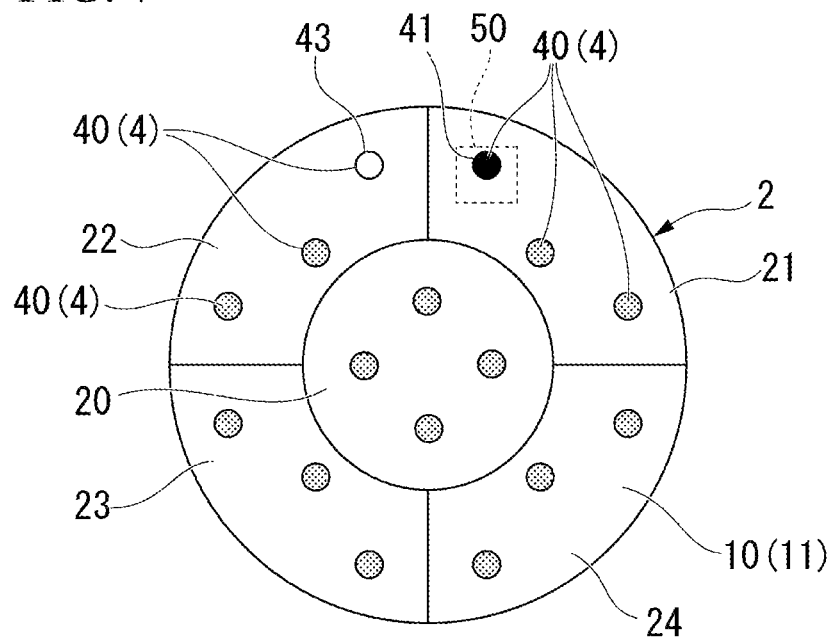
FIG. 7 is a plan view for explaining an example of temperature control according to a first modified example of the embodiment.

For example, as shown in FIG. 7, the control part may control the temperature adjustment part in one (the first outer region 21 in the example of FIG. 7) of two regions which are adjacent to each other in a plan view among the plurality of regions and may control the temperature adjustment part in the other (the second outer region 22 in the example of FIG. 7) of the two regions on the basis of the selected detection temperature. With such a constitution, even when there is a local heat input in the first outer region 21 on the placement surface 10 on which the semiconductor wafer is placed, and the adjacent second outer region 22 is thermally affected, it is possible to respond quickly.

For example, when the temperature adjustment part is controlled in the second outer region 22, the control part may select the detection temperature detected by the one (the temperature sensor 43 indicated by a white circle) closest to the temperature detection part (the temperature sensor 41 indicated by a black circle) in the first outer region 21 among the plurality of temperature detection parts (the three temperature sensors 40) in the second outer region 22, and may control the temperature adjustment part in the second outer region 22 on the basis of the selected detection temperature.

In the above-described embodiment, the example in which the temperatures are monitored at the plurality of locations in a predetermined region of the plurality of regions partitioned from each other in a plan view, a semiconductor wafer is placed on the placement surface having the plurality of regions, the one having the largest temperature change per unit time among the monitored temperatures at the plurality of locations is selected, and the temperature of the region is adjusted on the basis of the selected temperature has been described, but the present invention is not limited thereto.

Figure 8:
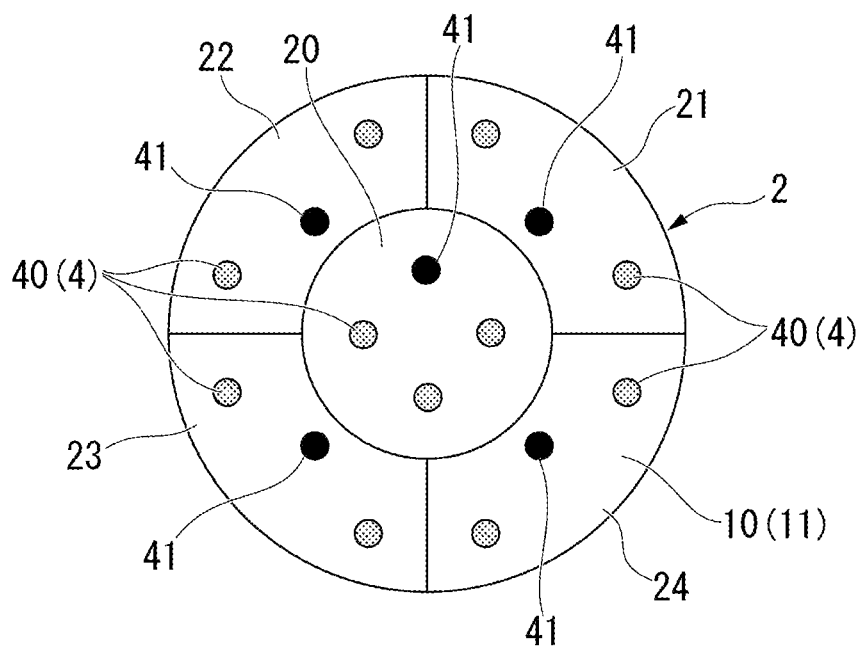
FIG. 8 is a plan view for explaining an example of temperature control according to a second modified example of the embodiment.

For example, as shown in FIG. 8, the temperatures may be monitored at the plurality of locations in all the plurality of regions, the one having the largest temperature change per unit time among the monitored temperatures at the plurality of locations may be selected, and the temperatures of all the regions may be adjusted on the basis of the selected temperature. For example, when the temperature adjustment part in each of the regions 20 to 24 is controlled, the control part may control the temperature adjustment part in each of the regions 20 to 24 on the basis of only one control point (for example, the detection temperature of the temperature sensor 41 indicated by a black circle in FIG. 8) in each of the regions 20 to 24. For example, a temperature adjustment mode in each of the regions can be changed according to the required specifications.

In the above-described embodiment, the example in which the placement part is formed in a plate shape having the placement surface on the first surface has been described, but the present invention is not limited thereto. For example, the placement part may be formed in a block shape having the placement surface on the first surface. For example, the shape of the placement part can be changed according to the required specifications.

In the above-described embodiment, the example in which the temperature adjustment part is provided on the second surface of the placement part on the side opposite to the side on which the placement surface is provided has been described, but the present invention is not limited thereto. For example, the temperature adjustment part may be built in the placement part. For example, an installation mode of the temperature adjustment part can be changed according to the required specifications.

In the above-described embodiment, the example in which the temperature detection part is disposed in the recessed part of the placement part through the through hole of the temperature adjustment part, and the temperature of the region is detected through the recessed part of the placement part has been described, but the present invention is not limited thereto. For example, the temperature detection part may detect the temperature of the region without involving the recessed part of the placement part. For example, the temperature detection part may be a non-contact type temperature sensor. For example, a mode of the temperature detection part can be changed according to the required specifications.

In the above-described embodiment, as an example of the temperature control method for a semiconductor wafer, the example in which the temperature is monitored before the wafer is placed (the example in which the temperature monitoring process is followed by the wafer placement process) has been described, but the present invention is not limited thereto. For example, a timing of temperature monitoring can be changed according to the required specifications.

In the above-described embodiment, as an example of the temperature control device for a semiconductor wafer, the temperature control device in which the temperature (the temperature of the semiconductor wafer having a local heat input because of energization) of the semiconductor wafer having a chip of which the electrical characteristics are inspected by energization is controlled to a target temperature has been described, but the present invention is not limited thereto. For example, the temperature control device may be applied to a temperature control device in which a temperature of a semiconductor wafer having no chip of which electrical characteristics are inspected by energization is controlled to a target temperature. For example, the temperature control device may be applied to a temperature control device in which a temperature of a semiconductor wafer such as a silicon wafer is controlled to a target temperature. For example, the temperature control device may be used in a dry process. For example, a usage mode of the temperature control device can be changed according to the required specifications.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A temperature control device for a semiconductor wafer, comprising:
    a placement part having a placement surface on which a semiconductor wafer is placed and having a plurality of regions into which the placement surface is partitioned in a plan view;
    a temperature adjustment part configured to independently adjust a temperature of the placement part for each of the plurality of regions;
    a plurality of temperature detection parts provided in at least one of the plurality of regions and configured to detect a temperature of the region of which the temperature has been adjusted by the temperature adjustment part; and
a control part configured to monitor detection temperatures of the plurality of temperature detection parts, to select one having a large temperature change per unit time among the plurality of monitored detection temperatures, and to control the temperature adjustment part based on the selected detection temperature, wherein a plurality of the temperature detection parts are provided in each of the plurality of regions, and
    the control part controls the temperature adjustment part in one of two regions adjacent to each other in a plan view among the plurality of regions and controls the temperature adjustment part in the other one of the two regions based on the selected detection temperature.

2. The temperature control device for a semiconductor wafer according to claim 1, wherein the placement surface is formed in a circular shape in a plan view, and the plurality of temperature detection parts are disposed apart from each other in a circumferential direction and a radial direction of the placement surface in a plan view.

3. The temperature control device for a semiconductor wafer according to claim 2, wherein the plurality of regions include a central region which is provided in a center of the placement surface in a plan view and is formed in a circular shape in a plan view, and a plurality of outer regions which are partitioned from each other in the circumferential direction on a radially outer side of the central region in a plan view and are formed in an arc shape in a plan view, and
    the plurality of temperature detection parts are disposed apart from each other in the central region and each of the plurality of outer regions in a plan view.

4. The temperature control device for a semiconductor wafer according to claim 1, wherein the placement part is formed in a plate shape having the placement surface on a first surface,
    the temperature adjustment part is provided on a second surface of the placement part on a side opposite to a side on which the placement surface is provided,
    the placement part has a recessed part which opens on the second surface,
    the temperature adjustment part has a through hole connected to the recessed part, and
    the temperature detection part is disposed in the recessed part through the through hole.

5. The temperature control device for a semiconductor wafer according to claim 1, wherein the temperature adjustment part includes a thermoelectric element.

6. A temperature control device for a semiconductor wafer, comprising:
    a placement part having a placement surface on which a semiconductor wafer is placed and having a plurality of regions into which the placement surface is partitioned in a plan view;
    a temperature adjustment part configured to independently adjust a temperature of the placement part for each of the plurality of regions;
    a plurality of temperature detection parts provided in at least one of the plurality of regions and configured to detect a temperature of the region of which the temperature has been adjusted by the temperature adjustment part; and
    a control part configured to monitor detection temperatures of the plurality of temperature detection parts, to select one having a large temperature change per unit time among the plurality of monitored detection temperatures, and to control the temperature adjustment part based on the selected detection temperature, wherein the placement part is formed in a plate shape having the placement surface on a first surface,
    the temperature adjustment part is provided on a second surface of the placement part on a side opposite to a side on which the placement surface is provided,
    the placement part has a recessed part which opens on the second surface,
    the temperature adjustment part has a through hole connected to the recessed part, and
    the temperature detection part is disposed in the recessed part through the through hole.

* * * * *